US009355960B2

(12) United States Patent
Hsieh et al.

(10) Patent No.: US 9,355,960 B2
(45) Date of Patent: May 31, 2016

(54) ELECTROMAGNETIC BANDGAP STRUCTURE FOR THREE DIMENSIONAL ICS

(71) Applicant: Taiwan Semiconductor Manufacturing Co., Ltd., Hsin-Chu (TW)

(72) Inventors: Hsieh-Hung Hsieh, Taipei (TW); Tzu-Jin Yeh, Hsinchu (TW); Sa-Lly Liu, HsinChu (TW); Tzong-Lin Wu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/264,076

(22) Filed: Apr. 29, 2014

(65) Prior Publication Data

US 2015/0311159 A1 Oct. 29, 2015

Related U.S. Application Data

(60) Provisional application No. 61/915,890, filed on Dec. 13, 2013.

(51) Int. Cl.
*H01L 23/538* (2006.01)
*H01L 25/065* (2006.01)
(Continued)

(52) U.S. Cl.
CPC .......... *H01L 23/5384* (2013.01); *H01L 23/481* (2013.01); *H01L 23/5223* (2013.01); *H01L 23/5226* (2013.01); *H01L 23/5227* (2013.01); *H01L 25/0657* (2013.01); *H01L 24/05* (2013.01); *H01L 24/13* (2013.01); *H01L 24/16* (2013.01); *H01L 24/17* (2013.01); *H01L 2224/0401* (2013.01);

(Continued)

(58) Field of Classification Search
CPC .. H01L 23/5384; H01L 24/89; H01L 25/0657
USPC .......................................................... 257/737
See application file for complete search history.

(56) References Cited

U.S. PATENT DOCUMENTS

2007/0289771 A1* 12/2007 Osaka et al. ................... 174/250
2010/0156523 A1* 6/2010 Kwon et al. ................... 327/551
2012/0217653 A1* 8/2012 Takemura et al. ............. 257/774

OTHER PUBLICATIONS

Kim, K. H. et al., "Analysis and modeling of hybrid planar-type electromagnetic-bandgap structures and feasibility study on power distribution network applications," IEEE Trans. Microw.Theory Tech., Jan. 2008, 56(1):178-186.

(Continued)

*Primary Examiner* — Christine Enad
(74) *Attorney, Agent, or Firm* — Duane Morris LLP

(57) ABSTRACT

An electromagnetic bandgap (EBG) cell comprises a plurality of first conductive line layers beneath a first integrated circuit (IC) die, wherein wires on at least one of the first conductive line layers are each connected to one of a high voltage source and a low voltage source and are oriented to form a first mesh structure at a bottom of the EBG cell. The EBG cell further comprises a pair of through-substrate-vias (TSVs) above the plurality of first conductive line layers, wherein the pair of TSVs penetrate the first IC die and are connected to a high voltage source and a low voltage source, respectively, and a pair of micro bumps above a dielectric layer above the pair of TSVs, wherein the micro bumps connect the TSVs of the first IC die with a plurality of second conductive line layers formed on a second IC die.

20 Claims, 12 Drawing Sheets

(51) Int. Cl.
  *H01L 23/48* (2006.01)
  *H01L 23/522* (2006.01)
  *H01L 23/00* (2006.01)

(52) U.S. Cl.
  CPC ............ *H01L 2224/05009* (2013.01); *H01L 2224/13025* (2013.01); *H01L 2224/16146* (2013.01); *H01L 2224/16225* (2013.01); *H01L 2224/17181* (2013.01); *H01L 2225/06513* (2013.01); *H01L 2225/06517* (2013.01); *H01L 2225/06541* (2013.01); *H01L 2225/06544* (2013.01); *H01L 2225/06565* (2013.01); *H01L 2924/14* (2013.01); *H01L 2924/30105* (2013.01); *H01L 2924/30107* (2013.01)

(56) References Cited

OTHER PUBLICATIONS

Wu, T.L. et al., "Overview of power integrity solutions on package and PCB: decoupling and EBG isolation," IEEE Trans. Electromagn. Compat. (Invited paper), May 2010, 52(2):346-356.

Park, J. et al., "Double-stacked EBG structure for wideband suppression of simultaneous switching noise in LTCC-based SiP applications," IEEE Microw. Wireless Compon. Lett., Sep. 2006, 16(9):481-483.

Lee, J. et al., "High dielectric constant thin film EBG power/ground network for broad-band suppression of SSN and radiated emissions," IEEE Microw. Wireless Compon. Lett., Aug. 2005, 15(8):505-507.

Wang, T.K. et al., "A novel power/ground layerusing artificial substrate EBG for simultaneously switching noisesuppression," IEEE Trans. Microw. Theory Tech., May 2008, 56(5):1164-1171.

Kamgaing, T. et al., "Design and modeling of high-impedance electromagnetic surfaces for switching noise suppression in power planes," IEEE Trans. Electromagn. Compat., Aug. 2005, 47(3):479-489.

Wu, T.L. et al., "A novel power plane with super-wideband elimination of ground bounce noise on high speed circuits," IEEE Microw. Wireless Compon. Lett., Mar. 2005, 15(3):174-176.

Wang, T. K. et al., "Design and modeling of a stopband-enhanced EBG structure using ground surface perturbation lattice for power/ground noise suppression," IEEE Trans. Microw. Theory Tech., Aug. 2009, 57(8):2047-2054.

\* cited by examiner

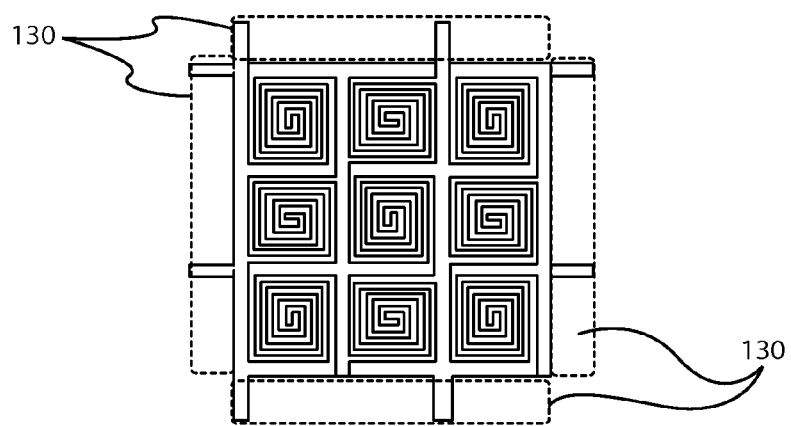
FIG. 5A
   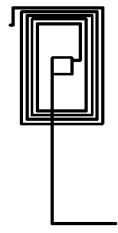
FIG. 5B     FIG. 5C     FIG. 5D     FIG. 5E

ELECTROMAGNETIC BANDGAP STRUCTURE FOR THREE DIMENSIONAL ICS

PRIORITY CLAIM AND CROSS-REFERENCE

This application claims the benefit of U.S. Provisional Patent Application No. 61/915,890, filed Dec. 13, 2013, and entitled "Electromagnetic Bandgap Structure For Three Dimensional ICS," and is hereby incorporated herein by reference.

FIELD OF DISCLOSURE

The disclosed systems and methods relate to semiconductor devices. More particularly, the disclosed devices and methods relate to electromagnetic bandgap structures for noise reduction.

BACKGROUND

An electromagnetic bandgap (EBG) structure is a structure in which dielectric materials or conductors are arranged two-dimensionally or three-dimensionally. The EBG structure is typically a periodic structure in which the units or EBG cells repeat and expand themselves across the structure following certain repeated pattern (e.g., an array). The EBG structure defines a frequency range called a bandgap or stopband that suppresses or greatly attenuates the propagation of electromagnetic waves within a certain frequency band. As a result, the EBG structure only allows waves at some frequencies outside of the bandgap to propagate through its periodic structure and the EBG structure can be used to suppress noise at high frequencies.

Among the noises of a semiconductor device, simultaneously switching noise (SSN) and power/ground bounce noise (GBN) may have severe adverse effects on the performance of the semiconductor device. In both cases, current leaks through some effective inductance in the semiconductor device may lead to unwanted voltage drop and cause power integrity and signal integrity problems.

BRIEF DESCRIPTION OF THE DRAWINGS

FIG. 5A depicts a plurality of bridges utilized to connect the high and low voltage connecting wires between the EBG cells.

FIGS. 5B-E depict the connecting wires in each of the bridges in FIG. 5A that can have various configurations to further reduce the stopband frequencies of the EBG cells.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

A structure of electromagnetic bandgap (EBG) cells is disclosed, having through-substrate-vias (TSVs) to perform noise isolation for three dimensional (3D) IC applications. Each proposed EBG cell comprises at least a pair of TSVs and corresponding micro bumps connected to the high and low voltage sources, respectively, as well as a plurality of conductive (e.g., metal or polysilicon) line layers of interconnect wires on both ends of the EBG cell. The interconnect wires in the conductive line layers are arranged in various shapes, sizes, forms, and relative positions with respect to each other in order to reduce the stopband frequency of the EBG cell for 3D IC applications.

Figure 1:
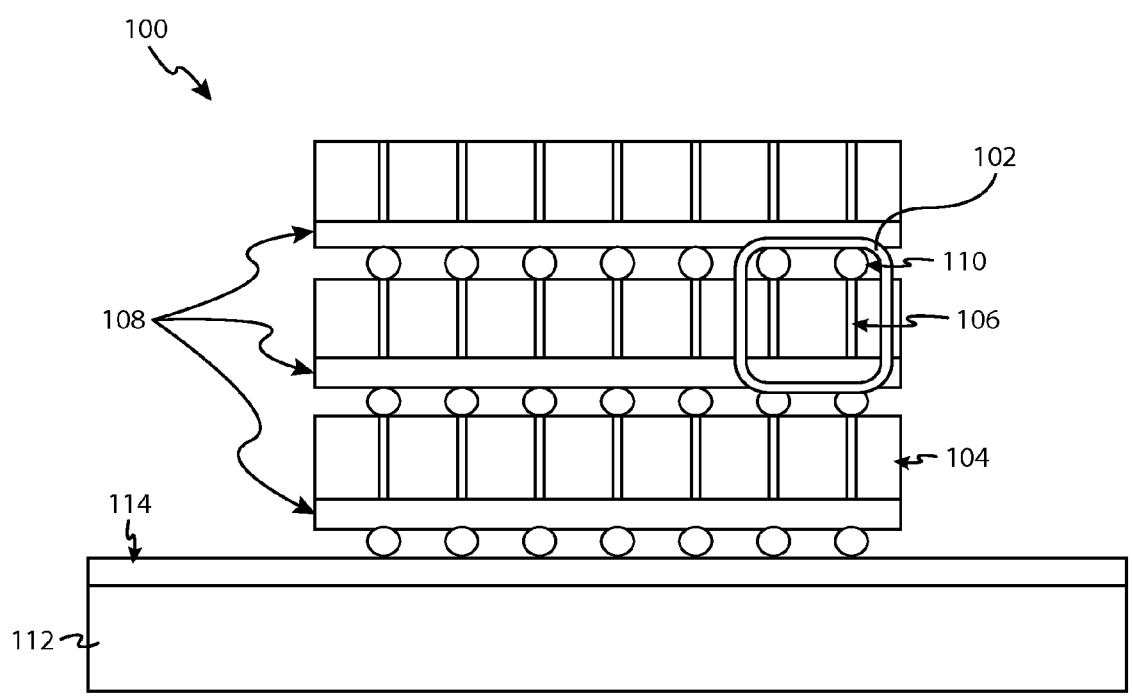
FIG. 1 depicts an example of an EBG structure having a plurality of EBG cells 102 included in a three dimensional (3D) integrated circuit (IC) package.

FIG. 1 depicts an example of an EBG structure having a plurality of EBG cells 102 included in a three dimensional (3D) integrated circuit (IC) package 100. Here, 3D IC package 100 contains two or more IC dies or chips 104 stacked vertically so that they occupy less space in the package. Power and signal communication connections between the vertically stacked ICs 104 (e.g., flip chips) are made using through-substrate-vias (TSVs) 106, which pass through the entire thickness of each die 104, permitting connections between devices and/or conductive patterns on the front face and back face of the die 104. The resulting stacked 3D IC package has no added length or width. A plurality of metal layers 108 is placed at the bottom of each IC die 104, wherein the plurality metal layers provide power and signal connections within each IC die 104 and/or between different IC dies 104 stacked on top of each other. For a non-limiting example, each of the interconnect structures 108 (including a plurality of conductive line layers and/or via layers) include two or more layers of copper (Cu) wires plus one redistribution layer (RDL) of aluminum (Al) wires. In some embodiments, a plurality of micro bumps 110 are utilized for chip to chip and chip to interposer connections. As shown in FIG. 1, the micro bumps 110 connect the TSVs 106 of one IC die 104 with the conductive line layers 108 of another IC die 104. An EBG cell 102 in the EBG structure includes a pair of TSVs 106, a pair of corresponding micro bumps 110 and the connecting wires from the metal layers 108 on both the top and the bottom of the EBG cell 102 as shown in FIG. 1. In some alternative embodiments, different IC dies 104 are stacked vertically together without using the micro bumps 110, where the TSVs are also replaced by inter-layer vias (ILVs) for connections between the IC dies 104.

In some embodiments, an interposer 112 is included. An interposer is a carrier substrate having no active device layers, and is used to connect and integrate one two dimensional (2D) or 3D IC package 100 with another 2D or 3D IC package (not shown in FIG. 1). Although FIG. 1 shows a single stack of ICs 104 mounted to the interposer 112, other embodiments (not shown) can have plural dies and/or die stacks mounted to a single interposer. As shown in FIG. 1, interposer 112 has a plurality of interconnect layers 114 formed on top of it, wherein the interconnect layers 114 can include three or more Cu layers plus one RDL layer, for example. The metal layers 114 on the top of the interposer 112 are connected to the metal layers 108 on the bottom of the IC chip 104 via micro bumps 110.

Figures 2A, 2B:
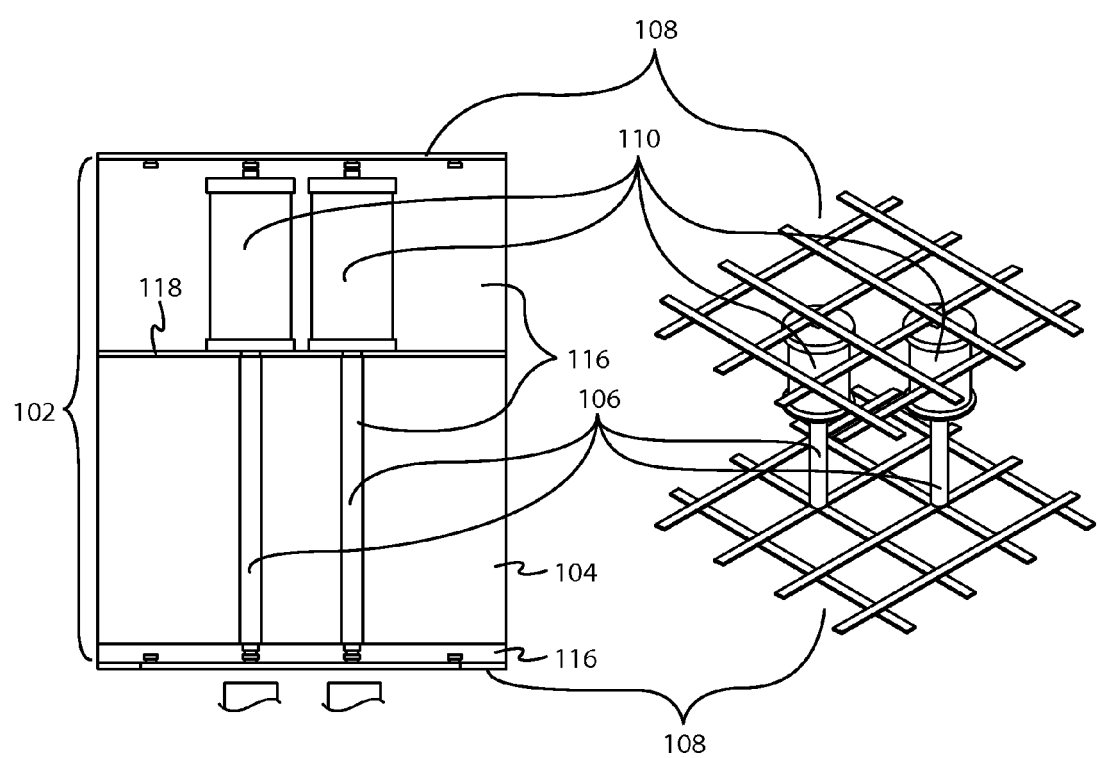
FIGS. 2A and 2B depict expanded side view and three dimensional view of an EBG cell, respectively.

FIGS. 2A and 2B depict expanded side view and three dimensional view of an EBG cell 102, respectively. As shown in FIGS. 2A and 2B, the EBG cell 102 includes a pair of TSVs 106 connecting to a high power/voltage source (e.g., Vdd) and a low power/voltage source (e.g., GND), respectively. The TSVs 106 are embedded in IC die 104 separated by a dielectric (e.g., oxide or low-k dielectric) layer 116. In some embodiments, the TSVs 106 connect to their corresponding micro bumps 110 via a backside metal layer 118, wherein the micro bumps 110 are embedded in oxide layer 116. As shown in FIGS. 2A and 2B, a plurality of metal layers 108, which can include three or more conductive line layers (e.g., M1-M3) of copper wires connected by via layers, and an RDL layer of aluminum wires, are formed on the bottom of the IC 104 and connected to the TSVs 106 and the top of micro bumps 110, respectively. The metal layers 108 connect to another IC chip 104 or interposer 112 above or below.

In some embodiments, TSVs 106 are made of one or more materials (e.g., copper) that generates mutual inductance with each other, which in combination with the capacitance created by the mesh of the metal layers 108, helps to reduce the stopband frequencies of the EBG cell for the three dimensional IC applications.

Figure 3A:
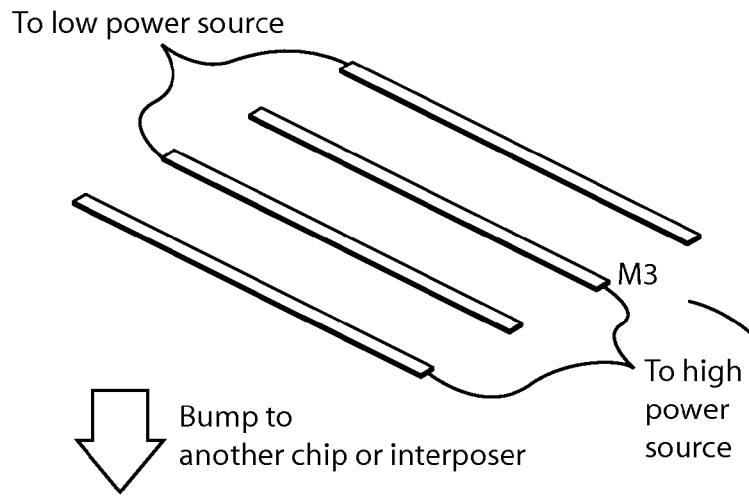
FIGS. 3A-3J show an example of a manufacturing process of an EBG cell having at least a pair of TSVs, at least a pair of micro bumps, and a plurality of metal layers on both the top and the bottom for connection to another IC chip or interposer.
Figure 3B:
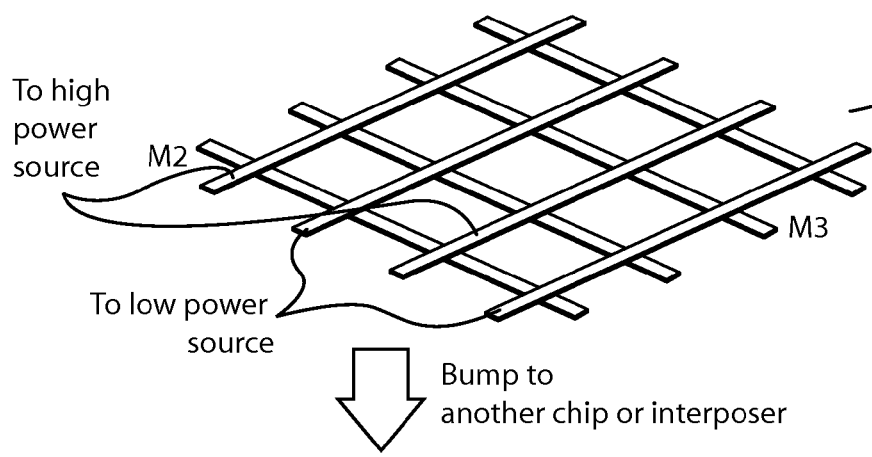
Figure 3C:
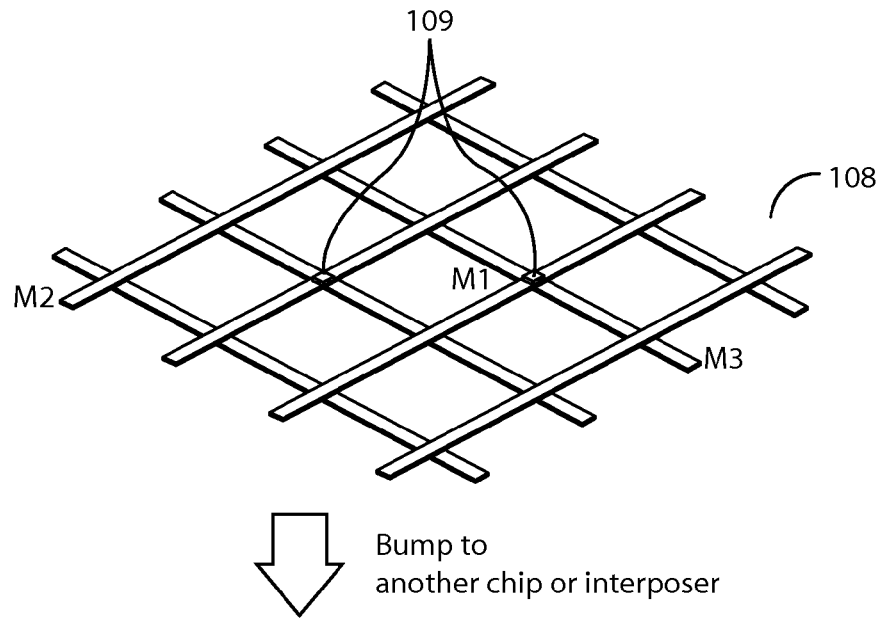
Figure 3D:
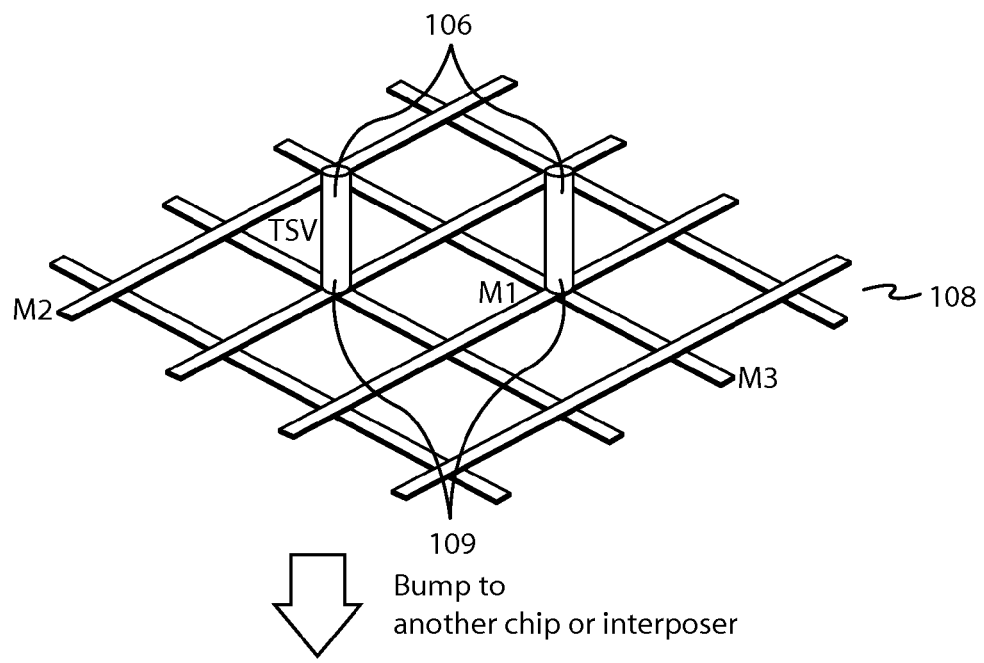
Figure 3E:
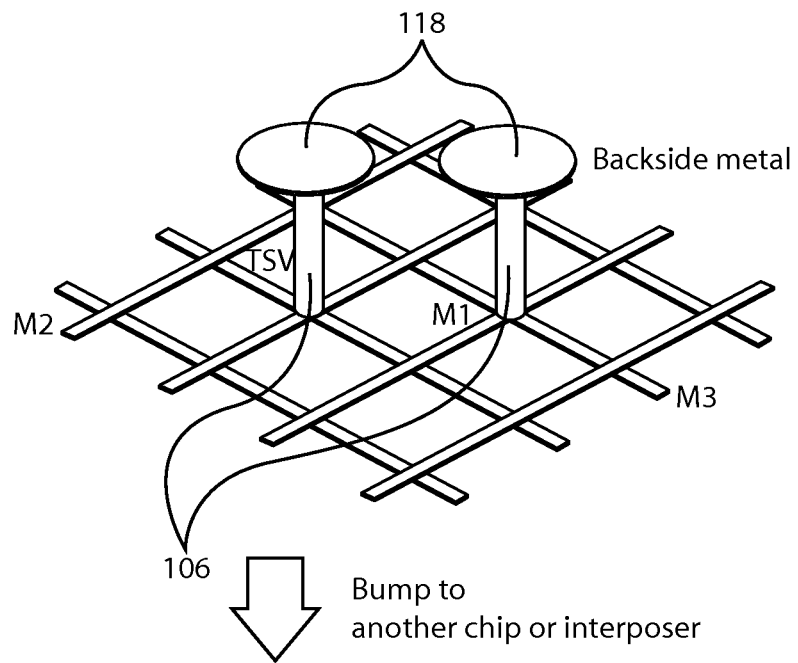
Figure 3F:
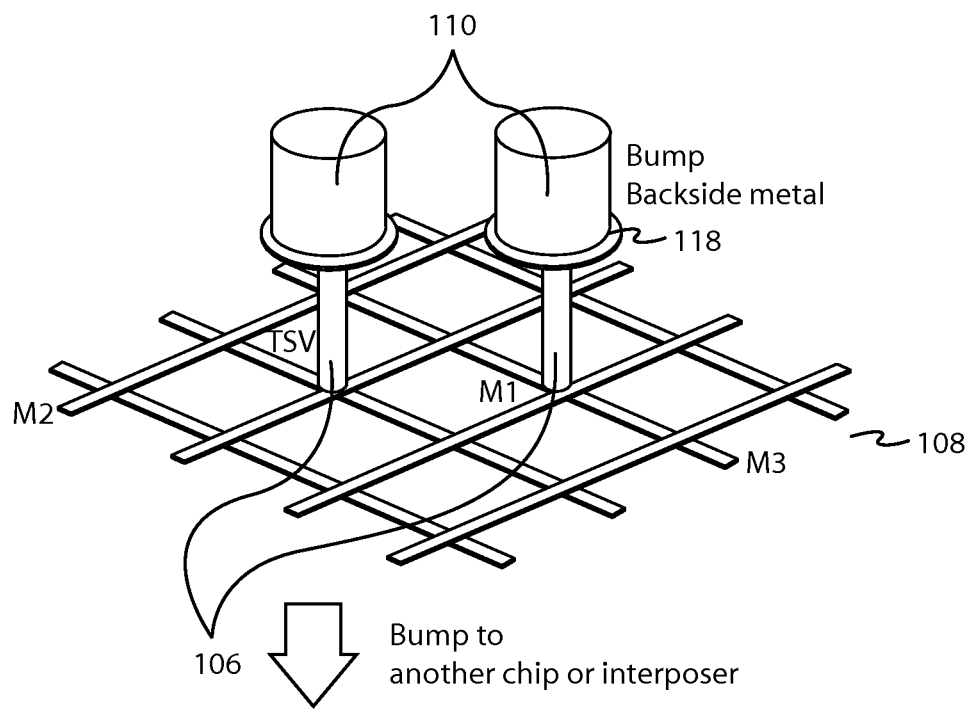
Figure 3G:
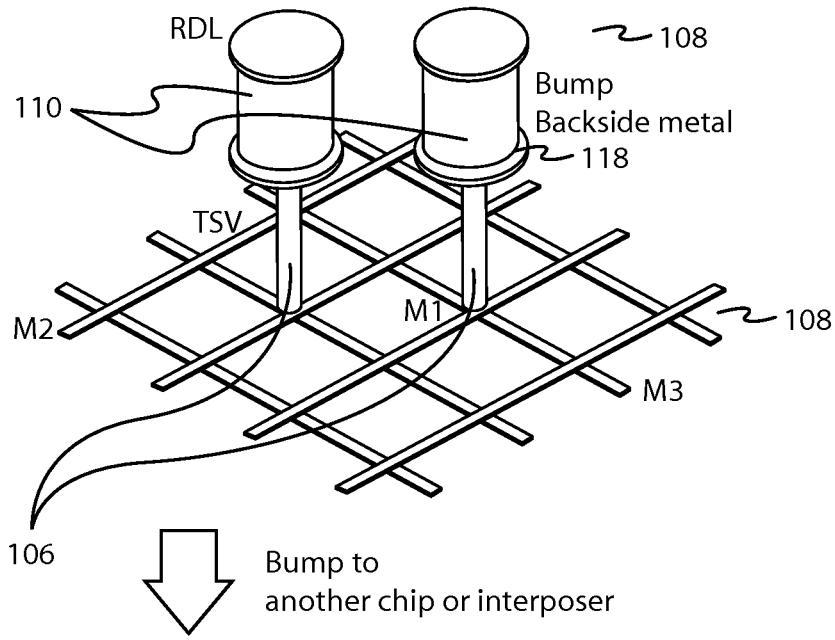
Figure 3H:
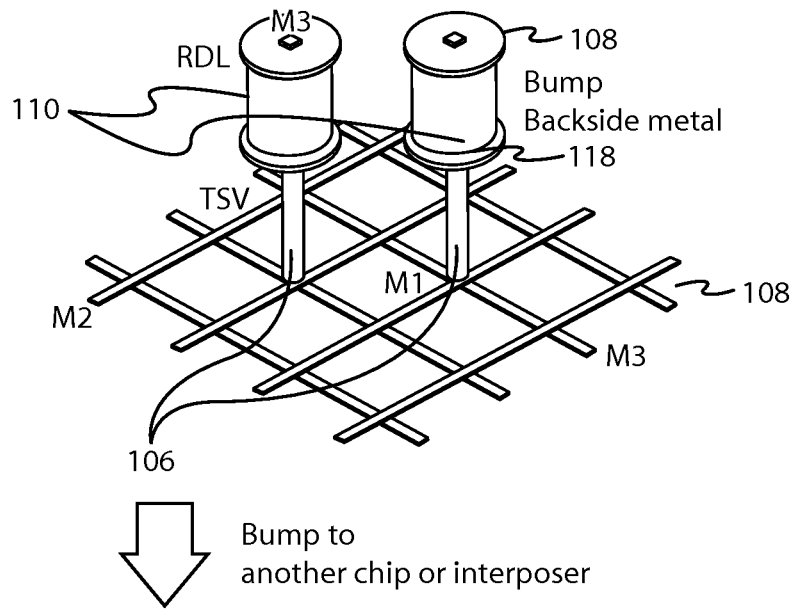
Figure 3I:
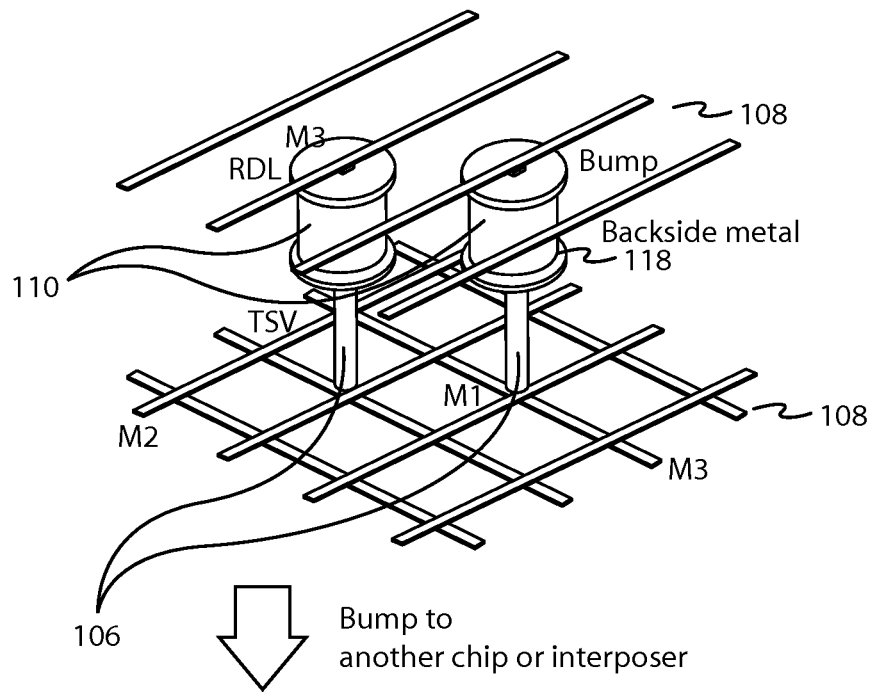
Figure 3J:
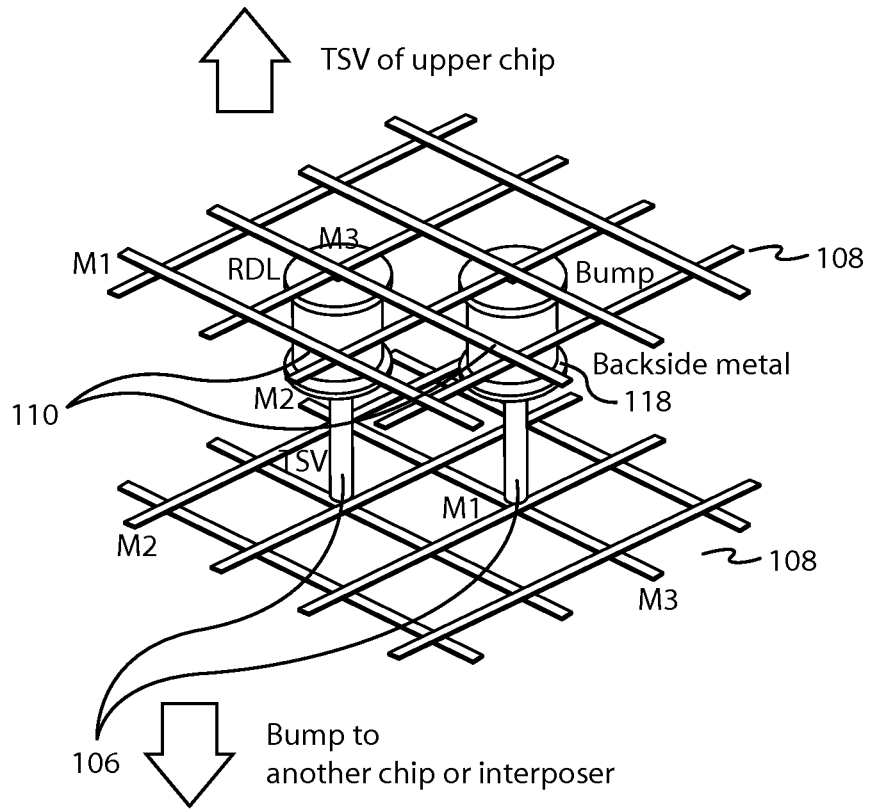

FIGS. 3A-3J show an example of a manufacturing process of an EBG cell 102 having a pair of TSVs 106, a pair of micro bumps 110, and a plurality of metal layers 108 on both the top and the bottom for connection to another IC chip or interposer to the top and the bottom of the EBG cell 102, respectively. In FIGS. 3A-3J, the conductive line layers and TSVs are shown, but the substrate 104 is omitted for ease of viewing. The substrate 104 is nevertheless included in all of the configurations of FIGS. 3A-3J. As shown in FIG. 3A, a plurality of wires on a M3 layer in the bottom metal layers 108 are formed, wherein at least some of the M3 wires connect to high power source and low power source (not shown), respectively. A plurality of wires on a M2 layer in the bottom metal layers 108 are formed on top of the M3 layer as shown in FIG. 3B, wherein at least some of the M2 wires also connect to high power source and low power source, respectively, and the M2 wires are placed in a different orientation from the M3 wires to form a mesh structure, resulting in a capacitve coupling between M2 and M3. In some embodiments, contact points 109 to TSVs 106 are formed on M1 layer of the bottom metal layers 108 as shown in FIG. 3C. These contact points 109 are used for connections with the TSVs 106. A pair of TSVs 106 are then formed on the M1 contact points 109 as shown in FIG. 3D. Once the TSVs 106 are formed, a layer of backside metal material is formed on top of the TSVs 106 for connection with micro bumps 110 as shown in FIG. 3E. A pair of micro bumps 110 are then formed on the pair of TSVs 106 as shown in FIG. 3F. Once the micro bumps 110 are formed on the TSVs 106, a redistribution layer (RDL) 720 is formed on the micro bumps 110 as part of the top metal layers 108 as shown in FIG. 3G. FIGS. 3H-3J show the forming of M3, M2, and M1 layers of the top metal layers 108, respectively, wherein at least some of the metal wires in each of the M2 and M1 are connected to the high power source and low power source (not shown), respectively, and the metal wires on the M2 and M1 layers of the top metal layers 108 are placed in different orientations to form coupling capacitance for the EBG cell 102.

Figure 4A:
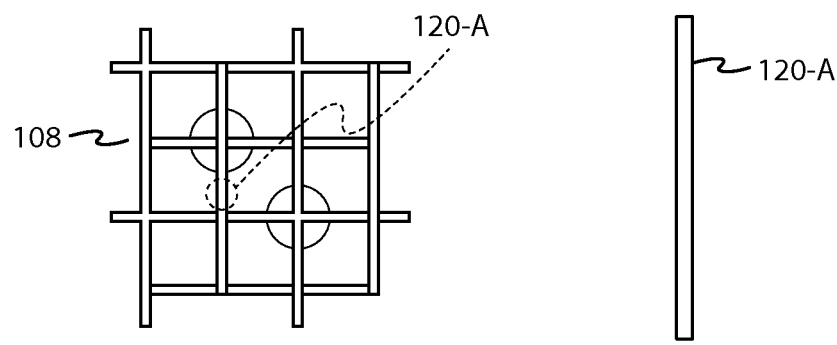
FIGS. 4A-4E depict examples of various configurations of wire segments on at least one of the top and/or bottom interconnect (e.g., M1-M3) layers of the EBG cell.
Figure 4B:
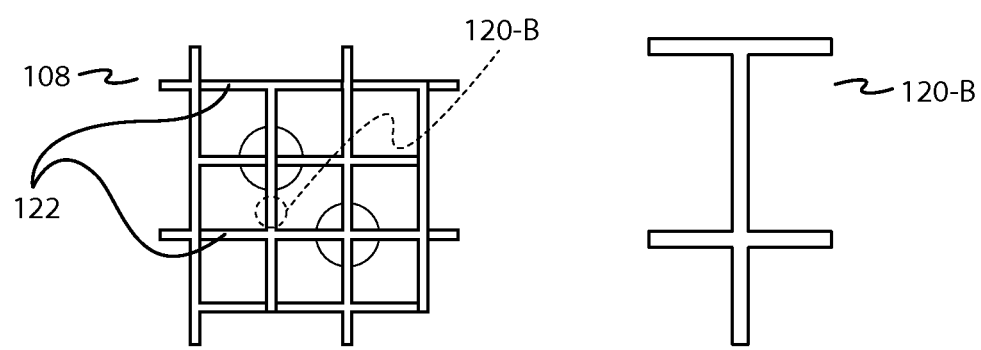
Figure 4C:
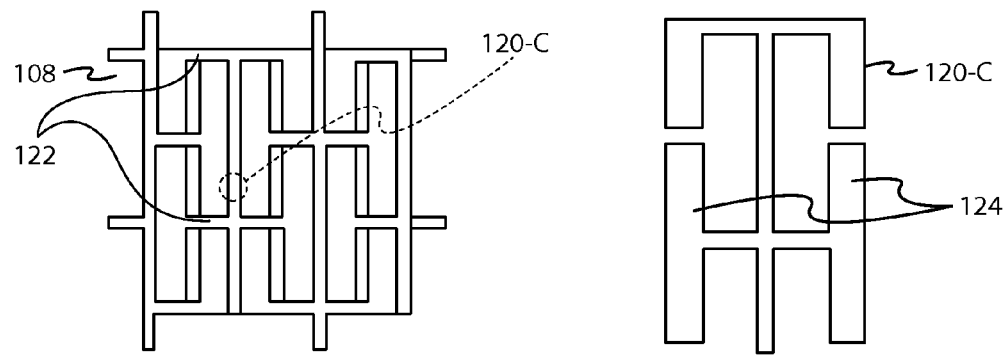
Figure 4D:
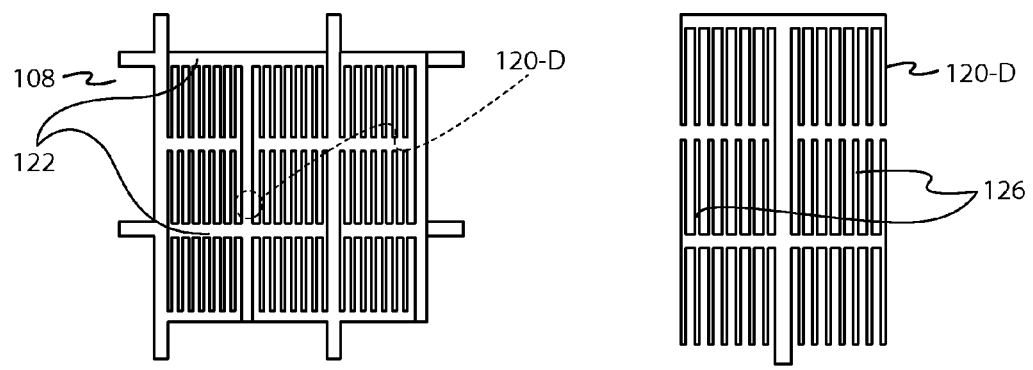
Figure 4E:
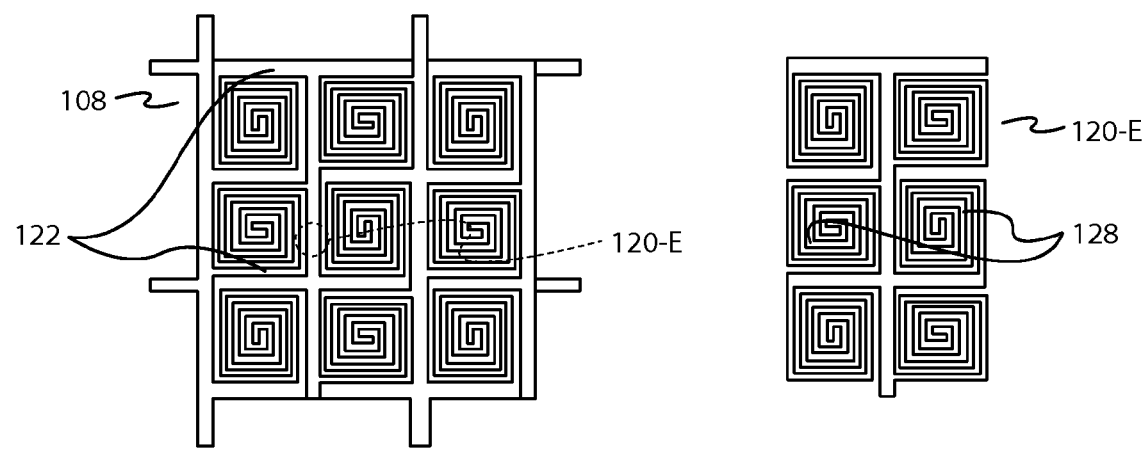

FIGS. 4A-4E depict examples of various configurations of wire segments on at least one of M1-M3 of the top and/or bottom metal layers 108 of EBG cell 102. FIG. 4A depicts an example of a straight line segment of vertical wire 120-A placed on one of the M1-M3 metal layers of 108, which is the simplest form of wire segment connecting to one of the high power source and low power source: FIG. 4B depicts an example of an alternative configuration of wire 120-B, which includes multiple segments connected together in the shape of a "fish-bone" 120-B having a first wire segment oriented in a first direction and a plurality of second wire segments oriented in a second direction perpendicular to and intersecting the first wire segment in the middle on one of the M1-M3 layers. As shown in FIG. 4B, at least a few segments 122 of wire 120-B overlap over wire segments placed on an adjacent metal layers, wherein the wire segments on the different metal layers connect to high and low power sources, respectively. Such overlapping further increases the coupling capacitance between the metal layers 108 from cross-point coupling between wires having different orientations, relative to a line coupling between wire segments aligned in the same X and Y directions on different metal layers. Such increased capacitance leads to further reduction in stopband frequency of EBG cell 102. In some embodiments, the fish-bone wire configuration of FIG. 4B can be further expanded with wings 124 of thick wire segments perpendicular to and extended at the end of the fish-bone 120-B as shown by the example of wire 120-C on one of the metal layers 108 in FIG. 4C. Here, the width and/or length of the wings of wire 120-C can be expanded until desired metal overlapping and thus coupling capacitance with wire segments 122 on an adjacent metal layer is reached. In some alternative embodiments, the fish-bone wire configuration can be expanded with so called "inter-digital wings" 126 of wire segments perpendicular to and extended along the fish-bone 120-B to form an "inter-digit fish-bone" as shown by the example of wire 120-D on one of the metal layers 108 in FIG. 4D. Such inter-digit fish-bone 126 not only enlarges the coupling capacitance between the overlapping wire segments 122 on different metal layers of 180, but also increases the coupling capacitance between the parallel wire segments placed on the same metal layer. In some other alternative embodiments, the fish-bone wire configuration can be expanded with spiral patterns 128 of wire segments along the fish-bone 120-B to form a "spiral fish-bone" 120-E as shown by one of the metal layers 108 in FIG. 4E. Using such spiral pattern, wire segments connected to high (e.g., Vdd) and low (e.g., GND) power sources can be entwined together on the same metal layer, which not only increases the coupling capacitance among the wire segments on the same layer, but also increases mutual inductance between the metal layers, which helps to further reduce the stopband frequency of EBG cell 102.

In an EBG structure having a plurality of EBG cells 102 included in a 3D IC package shown in FIG. 1, a plurality of bridges 130 are utilized to connect the high and low voltage connecting wires between the EBG cells 102 as shown in the example of FIG. 5A. Here, the connecting wires in each of the bridges 130 can have various configurations as shown in the examples of FIGS. 5B-E to further reduce the stopband frequencies of the EBG cells 102. FIG. 5B depicts the simplest form of connecting wires having two segments in each bridge 130. FIG. 5C depicts an example of a Z-shaped connecting wire having two 90 degree turns in each bridge 130. FIG. 5D depicts an example of a connecting wire having a serpentine (zig-zag) pattern in each bridge 130, wherein such zig-zag pattern increases the coupling capacitance as well as the inductance of the EBG cells 102. FIG. 5E depicts an example of a connecting wire having a spiral pattern in each bridge 130, wherein the spiral pattern also increases both the coupling capacitance and the inductance of the EBG cells 102.

Figure 6:
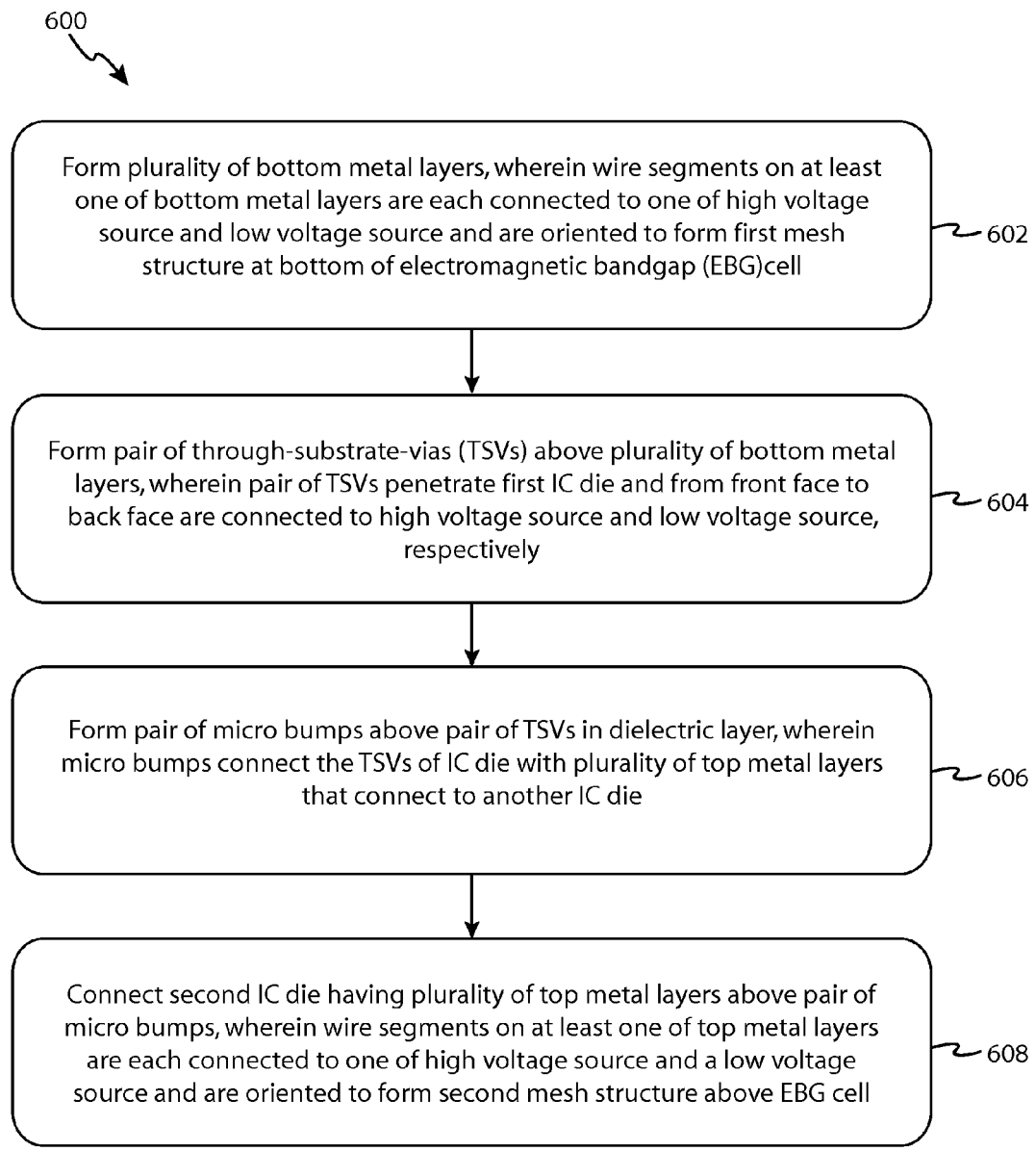
FIG. 6 is an example of a flow chart of a method for forming an EBG cell that includes TSVs, micro bumps, and metal layers configured to reduce the stopband frequency of the EBG cell.

FIG. 6 is an example of a flow chart 600 of a method for forming an EBG cell that includes TSVs, micro bumps, and metal layers configured to reduce the stopband frequency of the EBG cell.

At step 602, a plurality of bottom metal layers are formed, wherein wire segments on at least one of the bottom metal layers are each connected to one of a high voltage source and a low voltage source and are oriented to form a first mesh structure at bottom of the EBG cell.

At step 604, a pair of through-substrate-vias (TSVs) are formed above the plurality of bottom metal layers. The pair of TSVs penetrate a first IC die from a front face to a back face thereof, and are connected to a high voltage source and a low voltage source, respectively.

At step 606, a pair of micro bumps are formed above the pair of TSVs in a dielectric (e.g., oxide, nitride or low-k dielectric) layer, wherein the micro bumps connect the TSVs of the IC die with a plurality of top metal layers that connect to another IC die.

At step 608, a second IC die having said plurality of top metal layers is connected above the pair of micro bumps. Wire segments on at least one of the top metal layers are each connected to one of a high voltage source and a low voltage source and are oriented to form a second mesh structure above the EBG cell.

The structure of the EBG cells described above increases both the capacitance and the inductance of the EBG cell through the TSVs and the configuration of the wires on the plurality of metal layers on the top and the bottom of the EBG cell. An EBG structure for 3D IC applications having a plurality of such EBG cells arranged in the form of an array is able to suppress high frequency noises through reduced stopband frequencies and reduce the need for an oversized decoupling capacitance.

In some embodiments, an electromagnetic bandgap (EBG) cell comprises a plurality of first conductive line layers beneath a first integrated circuit (IC) die, wherein wires on at least one of the first conductive line layers are each connected to one of a high voltage source and a low voltage source and are oriented to form a first mesh structure at a bottom of the EBG cell. The EBG cell further comprises a pair of through-substrate-vias (TSVs) above the plurality of first conductive line layers, wherein the pair of TSVs penetrate the first IC die and are connected to a high voltage source and a low voltage source, respectively, and the EBG cell further comprises said plurality of second conductive line layers being above the pair of micro bumps, wherein wires on at least one of the second conductive line layers are each connected to a respective one of a high voltage source and a low voltage source and are oriented to form a second mesh structure of the EBG cell.

In some embodiments, the EBG cell further comprises a conductive line layer on a backside of the first IC die, having conductive lines which connect the pair of TSVs to the pair of micro bumps.

In some embodiments, the EBG cell further comprises a pair of micro bumps above a dielectric layer above the pair of TSVs, wherein the micro bumps connect the TSVs of the first IC die with a plurality of second conductive line layers formed on a second IC die.

In some embodiments, at least one of the wires in one of the top or bottom conductive line layers has a fish-bone shape having a first wire segment oriented in a first direction and a plurality of second wire segments oriented in a second direction perpendicular to and intersecting the first wire segment in the middle, wherein the wire overlaps with at least one of the wires on an adjacent conductive line layer.

In some embodiments, at least one of the wires in one of the top or bottom conductive line layers has the fish-bone shape with wings of thick wire segments perpendicular to and extended vertically at the end of the fish-bone that overlaps with at least one of the wires on an adjacent conductive line layer.

In some embodiments, at least one of the wires in one of the top or bottom conductive line layers has the fish-bone shape with inter-digital wings of wire segments perpendicular to and along the fish-bone.

In some embodiments, at least one of the wires in one of the top or bottom conductive line layers has the fish-bone shape with spiral patterns of wire segments along the fish-bone.

In some embodiments, an electromagnetic bandgap (EBG) structure in a three-dimensional (3D) integrated circuit (IC) package comprises a plurality of EBG cells; wherein each of the EBG cells includes one or more of: a plurality of first conductive line layers, wherein wire segments on at least one of the first conductive line layers are each connected to one of a high voltage source and a low voltage source and are oriented to form a first mesh structure at bottom of the EBG cell, a pair of through-substrate-vias (TSVs) above the plurality of bottom conductive line layers, wherein the pair of TSVs penetrate a first IC die and are connected to a high voltage source and a low voltage source, respectively, a pair of micro bumps above a dielectric layer above the pair of TSVs in an oxide layer, wherein the micro bumps connect the TSVs of the first IC die with a plurality of second conductive line layers formed on a second IC die, and said plurality of second conductive line layers being above the pair of micro bumps, wherein wire segments on at least one of the second conductive line layers are each connected to a respective one of a high voltage source and a low voltage source and are oriented to form a second mesh structure of the EBG cell. The EBG structure further comprises a plurality of bridges, wherein at least one of the bridges includes one or more connecting wires for connecting the high and low voltage source connecting wire segments in a first of the EBG cells to wire segments in a second of the EBG cells.

In some embodiments, the EBG structure further comprises an interposer connecting the 3D IC package with another 3D IC package.

In some embodiments, the plurality of EBG cells are arranged in a periodic pattern.

In some embodiments, at least one of the one or more connecting wires in the at least one bridge has multiple turns.

In some embodiments, at least one of the one or more connecting wires in the at least one bridge has a serpentine shape.

In some embodiments, at least one of the one or more connecting wires in the at least one bridge has a spiral shape.

In some embodiments, for forming an electromagnetic bandgap (EBG) cell comprises forming a plurality of first conductive line layers beneath a first integrated circuit (IC) die, wherein wires on at least one of the first conductive line layers are each connected to one of a high voltage source and a low voltage source and are oriented to form a first mesh structure at a bottom of the EBG cell. The method further comprises forming a pair of through-substrate-vias (TSVs) above the plurality of first conductive line layers, wherein the pair of TSVs penetrate the first IC die and are connected to a high voltage source and a low voltage source, respectively.

The method further comprises connecting a second IC die having said plurality of second conductive line layers being above the pair of micro bumps, wherein wires on at least one of the second conductive line layers are each connected to a respective one of a high voltage source and a low voltage source and are oriented to form a second mesh structure of the EBG cell.

In some embodiments, the method further comprises forming a conductive line layer on a backside of the first IC die, having conductive lines which connect the pair of TSVs to the pair of micro bumps.

In some embodiments, the method further comprises forming a pair of micro bumps above a dielectric layer above the pair of TSVs, wherein the micro bumps connect the TSVs of the first IC die with a plurality of second conductive line layers formed on a second IC die.

In some embodiments, the method further comprises forming at least one of the wires in one of the top or bottom conductive line layers having a fish-bone shape having a first wire segment oriented in a first direction and a plurality of second wire segments oriented in a second direction perpendicular to and intersecting the first wire segment in the middle, wherein the wire overlaps with at least one of the wires on an adjacent conductive line layer.

In some embodiments, the method further comprises forming at least one of the wires in one of the top or bottom conductive line layers in the fish-bone shape with wings of thick wire segments perpendicular to and extended at the end of the fish-bone that overlaps with at least one of the wires on an adjacent conductive line layer.

In some embodiments, the method further comprises forming at least one of the wires in one of the top or bottom conductive line layers in the fish-bone shape with inter-digital wings of wire segments perpendicular to and extended along the fish-bone.

In some embodiments, the method further comprises forming at least one of the wires in one of the top or bottom conductive line layers in the fish-bone shape with spiral patterns of wire segments along the fish-bone.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

We claim:

1. An electromagnetic bandgap (EBG) cell, comprising:
a plurality of first conductive line layers disposed beneath a first integrated circuit (IC) die, wherein wires on at least one of the first conductive line layers are each connected to one of a high voltage source and a low voltage source and are oriented to form a first mesh structure at a bottom of the EBG cell;
a pair of through-substrate-vias (TSVs) disposed above the plurality of first conductive line layers, wherein the pair of TSVs penetrate the first IC die and are connected to a high voltage source and a low voltage source, respectively;
a plurality of second conductive line layers disposed beneath a second IC and above the pair of TSVs, wherein wires on at least one of the second conductive line layers are each connected to a respective one of a high voltage source and a low voltage source and are oriented to form a second mesh structure of the EBG cell.

2. The EBG cell of claim 1, further comprising:
a conductive line layer disposed on a backside of the first IC die, having conductive lines which connect the pair of TSVs to a pair of micro bumps.

3. The EBG cell of claim 1, further comprising:
a pair of micro bumps disposed above the pair of TSVs, wherein the micro bumps connect the TSVs of the first IC die with the plurality of second conductive line layers.

4. The EBG cell of claim 1, wherein:
at least one wire in one of the first or second plurality of conductive line layers has a fish-bone shape having a first wire segment oriented in a first direction and a plurality of second wire segments oriented in a second direction perpendicular to and intersecting the first wire segment, wherein the at least one wire overlaps with at least one of the wires on an adjacent conductive line layer.

5. The EBG cell of claim 4, wherein:
at least one of the plurality of second wire segments comprises a wing of thick wire segment.

6. The EBG cell of claim 4, wherein:
at least one of the plurality of second wire segments comprises inter-digital wings of wire segments.

7. The EBG cell of claim 4, wherein:
at least one of the plurality of second wire segments comprises spiral patterns of wire segments.

8. An electromagnetic bandgap (EBG) structure in a three-dimensional (3D) integrated circuit (IC) package, comprising:
a plurality of EBG cells; wherein each of the EBG cells includes one or more of:
a plurality of first conductive line layers, wherein wire segments on at least one of the plurality of first conductive line layers are each connected to one of a high voltage source and a low voltage source and are oriented to form a first mesh structure at bottom of the EBG cell;
a pair of through-substrate-vias (TSVs) disposed above the plurality of first conductive line layers, wherein the pair of TSVs penetrate a first IC die and are connected to a high voltage source and a low voltage source, respectively;
a pair of micro bumps disposed above the pair of TSVs in an oxide layer, wherein the micro bumps connect the TSVs of the first IC die with a plurality of second conductive line layers formed on a second IC die;
said plurality of second conductive line layers being disposed above the pair of micro bumps, wherein wire segments on at least one of the second conductive line layers are each connected to a respective one of the high voltage source and the low voltage source and are oriented to form a second mesh structure of the EBG cell;
a plurality of bridges, wherein at least one of the bridges includes one or more connecting wires for connecting wire segments in a first of the EBG cells to wire segments in a second of the EBG cells.

9. The EBG structure of claim 8, further comprising:
an interposer connecting the 3D IC package with another 3D IC package.

10. The EBG structure of claim 8, wherein:
the plurality of EBG cells are arranged in a periodic pattern.

11. The EBG structure of claim 8, wherein:
at least one of the one or more connecting wires in the at least one bridge has multiple turns.

12. The EBG structure of claim 8, wherein:
at least one of the one or more connecting wires in the at least one bridge has a serpentine shape.

13. The EBG structure of claim 8, wherein:
at least one of the one or more connecting wires in the at least one bridge has a spiral shape.

14. A method for forming an electromagnetic bandgap (EBG) structure in a three-dimensional (3D) integrated circuit (IC) package, comprising:
forming a plurality of EBG cells; wherein each of the EBG cells includes one or more of:
  a plurality of first conductive line layers disposed beneath a first integrated circuit (IC) die, wherein wire segments on at least one of the plurality of first conductive line layers are each connected to one of a high voltage source and a low voltage source and are oriented to form a first mesh structure at a bottom of the EBG cell;
  a pair of through-substrate-vias (TSVs) disposed above the plurality of first conductive line layers, wherein the pair of TSVs penetrate the first IC die and are connected to the high voltage source and the low voltage source, respectively;
  a pair of micro bumps disposed above the pair of TSVs in an oxide layer, wherein the micro bumps connect the TSVs of the first IC die with a plurality of second conductive line layers formed on a second IC die;
  said plurality of second conductive line layers being disposed above the pair of micro bumps, wherein wire segments on at least one of the plurality of second conductive line layers are each connected to a respective one of the high voltage source and the low voltage source and are oriented to form a second mesh structure of the EBG cell; and
forming a plurality of bridges, wherein at least one of the bridges includes one or more connecting wires for connecting wire segments in a first of the EBG cells to wire segments in a second of the EBG cells.

15. The method of claim 14, further comprising:
forming an interposer connecting the 3D IC package with another 3D IC package.

16. The method of claim 14, further comprising:
arranging the plurality of EBG cells in a periodic pattern.

17. The method of claim 14, further comprising:
forming at least one of the one or more connecting wires in the at least one bridge with multiple turns.

18. The method of claim 14, further comprising:
forming at least one of the one or more connecting wires in the at least one bridge with a Z shape.

19. The method of claim 14, further comprising:
forming at least one of the one or more connecting wires in the at least one bridge with a serpentine shape.

20. The method of claim 14, further comprising:
forming at least one of the one or more connecting wires in the at least one bridge with a spiral shape.

\* \* \* \* \*